(12) United States Patent
Sugimura

(10) Patent No.: US 8,440,044 B2
(45) Date of Patent: May 14, 2013

(54) FORMING METHOD FOR POLYMERIC LAMINATED WAFERS COMPRISING DIFFERENT FILM MATERIALS

(75) Inventor: Hideyo Sugimura, North Oaks, MN (US)

(73) Assignee: Insight Equity A.P.X., L.P., Ramsey, MN (US)

( * ) Notice: Subject to any disclaimer, the term of this patent is extended or adjusted under 35 U.S.C. 154(b) by 0 days.

(21) Appl. No.: 13/192,399

(22) Filed: Jul. 27, 2011

(65) Prior Publication Data

US 2012/0113523 A1 May 10, 2012

Related U.S. Application Data

(63) Continuation of application No. 11/368,929, filed on Mar. 6, 2006, now Pat. No. 8,002,935.

(60) Provisional application No. 60/658,800, filed on Mar. 4, 2005.

(51) Int. Cl.
*B29D 11/00* (2006.01)

(52) U.S. Cl.
USPC ........................................ 156/272.2; 264/1.7

(58) Field of Classification Search .............. 156/272.2, 156/102, 196; 264/1.32, 2.7, 458, 481, 492; 359/754, 359/648, 642, 364, 362
See application file for complete search history.

(56) References Cited

U.S. PATENT DOCUMENTS

| | | | |
|---|---|---|---|
| 2,443,286 A | 6/1948 | Weston | |
| 2,618,200 A | 11/1952 | Clave et al. | |
| 3,051,054 A | 8/1962 | Crandon | |
| 3,560,076 A | 2/1971 | Ceppi | |
| 3,711,417 A | 1/1973 | Schuler | |
| 3,786,119 A | 1/1974 | Ortlieb | |
| 3,806,462 A | 4/1974 | Bloom | |
| 3,833,289 A | 9/1974 | Schuler | |
| 3,846,013 A | 11/1974 | Cohen | |
| 3,877,798 A | 4/1975 | Tolar et al. | |
| 3,878,282 A | 4/1975 | Bonis et al. | |
| 3,940,304 A | 2/1976 | Schuler | |
| 3,963,679 A | 6/1976 | Ullrich et al. | |
| 3,988,610 A | 10/1976 | Street | |
| 3,989,676 A | 11/1976 | Gerkin et al. | |
| 4,008,031 A | 2/1977 | Weber | |
| 4,012,232 A | 3/1977 | Uhlmann et al. | |
| 4,035,213 A | 7/1977 | Thoma et al. | |
| 4,035,524 A | 7/1977 | Fritsch | |
| 4,035,527 A | 7/1977 | Deeg | |
| 4,046,586 A | 9/1977 | Uhlmann et al. | |
| 4,085,919 A | 4/1978 | Sullivan | |

(Continued)

FOREIGN PATENT DOCUMENTS

| AU | 2003225785 B2 | 9/2003 |
|---|---|---|
| AU | 2004270746 B2 | 3/2005 |

(Continued)

OTHER PUBLICATIONS

United States Patent and Trademark Office, Office Action mailed Jul. 15, 2011 in U.S. Appl. No. 12/959,201, 13 pages.

(Continued)

*Primary Examiner* — Daniel McNally
(74) *Attorney, Agent, or Firm* — Inskeep IP Group, Inc.

(57) ABSTRACT

A method of making a polymeric laminated wafer comprising different film materials that are softenable and formable at different softening temperatures corresponding with the film materials.

20 Claims, 1 Drawing Sheet

U.S. PATENT DOCUMENTS

| | | |
|---|---|---|
| 4,091,057 A | 5/1978 | Weber |
| 4,106,861 A | 8/1978 | Brewer et al. |
| 4,160,853 A | 7/1979 | Ammons |
| 4,166,043 A | 8/1979 | Uhlmann et al. |
| 4,170,567 A | 10/1979 | Chu et al. |
| 4,211,590 A | 7/1980 | Steward et al. |
| 4,251,476 A | 2/1981 | Smith |
| 4,268,134 A | 5/1981 | Gulati et al. |
| 4,364,878 A | 12/1982 | Laliberte et al. |
| 4,367,170 A | 1/1983 | Uhlmann et al. |
| 4,409,169 A | 10/1983 | Bartholdsten et al. |
| 4,440,672 A | 4/1984 | Chu |
| 4,442,061 A | 4/1984 | Matsuda et al. |
| 4,490,495 A | 12/1984 | Weber |
| 4,495,015 A | 1/1985 | Petcen |
| 4,519,763 A | 5/1985 | Matsuda et al. |
| 4,540,534 A | 9/1985 | Grendol |
| 4,590,144 A | 5/1986 | Schornick et al. |
| 4,628,134 A | 12/1986 | Gould et al. |
| 4,645,317 A | 2/1987 | Frieder et al. |
| 4,650,533 A | 3/1987 | Parker et al. |
| 4,679,918 A | 7/1987 | Ace |
| 4,699,473 A | 10/1987 | Chu |
| 4,756,973 A | 7/1988 | Sakagami et al. |
| 4,767,647 A | 8/1988 | Bree |
| 4,781,452 A | 11/1988 | Ace |
| 4,793,703 A | 12/1988 | Fretz, Jr. |
| 4,828,769 A | 5/1989 | Maus et al. |
| 4,839,110 A | 6/1989 | Kingsbury |
| 4,867,553 A | 9/1989 | Frieder |
| 4,873,029 A | 10/1989 | Blum |
| 4,882,438 A | 11/1989 | Tanaka et al. |
| 4,883,548 A | 11/1989 | Onoki |
| 4,889,412 A | 12/1989 | Clere et al. |
| 4,889,413 A | 12/1989 | Ormsby et al. |
| 4,892,403 A | 1/1990 | Merle |
| 4,892,700 A | 1/1990 | Guerra et al. |
| 4,898,706 A | 2/1990 | Yabe et al. |
| 4,900,242 A | 2/1990 | Maus et al. |
| 4,917,851 A | 4/1990 | Yamada et al. |
| 4,927,480 A | 5/1990 | Vaughan |
| 4,933,119 A | 6/1990 | Weymouth, Jr. |
| 4,944,584 A | 7/1990 | Maeda et al. |
| 4,955,706 A | 9/1990 | Schmidthaler et al. |
| 4,960,678 A | 10/1990 | Tanaka et al. |
| 4,961,894 A | 10/1990 | Yabe et al. |
| 4,962,013 A | 10/1990 | Tateoka et al. |
| 4,968,545 A | 11/1990 | Fellman et al. |
| 4,969,729 A | 11/1990 | Merle |
| 4,985,194 A | 1/1991 | Watanabe |
| 4,992,347 A | 2/1991 | Hawkins et al. |
| 4,994,208 A | 2/1991 | McBain et al. |
| 5,015,523 A | 5/1991 | Kawashima et al. |
| 5,017,698 A | 5/1991 | Machida et al. |
| 5,049,321 A | 9/1991 | Galic |
| 5,049,427 A | 9/1991 | Starzewski et al. |
| 5,051,309 A | 9/1991 | Kawaki et al. |
| 5,073,423 A | 12/1991 | Johnson et al. |
| 5,106,998 A | 4/1992 | Tanaka et al. |
| 5,120,121 A | 6/1992 | Rawlings et al. |
| 5,130,058 A | 7/1992 | Tanaka et al. |
| 5,147,585 A | 9/1992 | Blum |
| 5,149,181 A | 9/1992 | Bedford |
| 5,175,201 A | 12/1992 | Forgione et al. |
| 5,188,787 A | 2/1993 | King et al. |
| 5,214,453 A | 5/1993 | Giovanzana |
| 5,223,862 A | 6/1993 | Dasher et al. |
| 5,246,989 A | 9/1993 | Iwamoto et al. |
| 5,252,450 A | 10/1993 | Schwerzel et al. |
| 5,266,447 A | 11/1993 | Takahashi et al. |
| 5,268,231 A | 12/1993 | Knapp-Hayes |
| 5,286,419 A | 2/1994 | Van Ligten et al. |
| 5,288,221 A | 2/1994 | Stoerr et al. |
| 5,292,243 A | 3/1994 | Gibbemeyer |
| 5,327,180 A | 7/1994 | Hester, III et al. |
| 5,336,261 A | 8/1994 | Barrett et al. |
| 5,349,065 A | 9/1994 | Tanaka et al. |
| 5,391,327 A | 2/1995 | Ligas et al. |
| 5,405,557 A | 4/1995 | Kingsbury |
| 5,430,146 A | 7/1995 | Tanaka et al. |
| 5,433,810 A | 7/1995 | Abrams |
| 5,434,707 A | 7/1995 | Dalzell et al. |
| 5,435,963 A | 7/1995 | Backovan et al. |
| 5,449,558 A | 9/1995 | Hasegawa et al. |
| 5,523,030 A | 6/1996 | Kingsbury |
| 5,531,940 A | 7/1996 | Gupta et al. |
| 5,631,720 A | 5/1997 | Guglielmetti et al. |
| 5,658,502 A | 8/1997 | Hughes |
| 5,699,182 A | 12/1997 | Alfekri |
| 5,702,645 A | 12/1997 | Hughes |
| 5,702,813 A | 12/1997 | Murata et al. |
| 5,708,063 A | 1/1998 | Imura et al. |
| 5,728,758 A | 3/1998 | Smith |
| 5,751,481 A | 5/1998 | Dalzell et al. |
| 5,757,459 A | 5/1998 | Bhalakia et al. |
| 5,770,115 A | 6/1998 | Misura |
| 5,800,744 A | 9/1998 | Munakata |
| 5,827,614 A | 10/1998 | Bhalakia et al. |
| 5,840,926 A | 11/1998 | Hughes |
| 5,851,328 A | 12/1998 | Kohan |
| 5,851,585 A | 12/1998 | Gupta et al. |
| 5,854,710 A | 12/1998 | Rao et al. |
| 5,856,860 A | 1/1999 | Bhalakia et al. |
| 5,872,648 A | 2/1999 | Sanchez et al. |
| 5,951,939 A | 9/1999 | Chernyak et al. |
| 6,025,026 A | 2/2000 | Smith et al. |
| 6,068,797 A | 5/2000 | Hunt |
| 6,074,579 A | 6/2000 | Greshes |
| 6,083,597 A | 7/2000 | Kondo |
| 6,096,246 A | 8/2000 | Chan et al. |
| 6,107,395 A | 8/2000 | Rosthauser et al. |
| 6,113,812 A | 9/2000 | Hughes |
| 6,113,813 A | 9/2000 | Goudjil |
| 6,114,437 A | 9/2000 | Brown et al. |
| 6,138,286 A | 10/2000 | Robrahn et al. |
| 6,145,984 A | 11/2000 | Farwig |
| 6,146,578 A | 11/2000 | Van Ert et al. |
| 6,150,430 A | 11/2000 | Walters et al. |
| 6,165,392 A | 12/2000 | Kobuchi et al. |
| 6,166,129 A | 12/2000 | Rosthauser et al. |
| 6,177,032 B1 | 1/2001 | Smith et al. |
| 6,180,033 B1 | 1/2001 | Greshes |
| 6,187,444 B1 | 2/2001 | Bowles, III et al. |
| 6,254,712 B1 | 7/2001 | Enlow et al. |
| 6,256,152 B1 * | 7/2001 | Coldrey et al. ............... 359/642 |
| 6,296,785 B1 | 10/2001 | Nelson et al. |
| 6,309,313 B1 | 10/2001 | Peter |
| 6,319,433 B1 | 11/2001 | Kohan |
| 6,328,446 B1 | 12/2001 | Bhalakia et al. |
| 6,333,073 B1 | 12/2001 | Nelson et al. |
| 6,334,681 B1 | 1/2002 | Perrott et al. |
| 6,353,078 B1 | 3/2002 | Murata et al. |
| 6,390,621 B1 | 5/2002 | Maki et al. |
| 6,416,690 B1 | 7/2002 | Soane et al. |
| 6,441,077 B1 | 8/2002 | Border et al. |
| 6,521,146 B1 | 2/2003 | Mead |
| 6,547,390 B1 | 4/2003 | Bernheim et al. |
| 6,585,373 B2 | 7/2003 | Evans et al. |
| 6,608,215 B2 | 8/2003 | Qin |
| 6,613,433 B2 | 9/2003 | Yamamoto et al. |
| 6,698,884 B2 | 3/2004 | Perrott et al. |
| 6,770,324 B2 | 8/2004 | Hooker |
| 6,797,383 B2 | 9/2004 | Nishizawa et al. |
| 6,807,006 B2 | 10/2004 | Nakagoshi |
| 6,814,896 B2 | 11/2004 | Bhalakia et al. |
| 6,863,844 B2 | 3/2005 | Engardio et al. |
| 6,863,848 B2 | 3/2005 | Engardio et al. |
| 6,971,116 B2 | 11/2005 | Takeda et al. |
| 7,004,583 B2 | 2/2006 | Miniutti et al. |
| 7,008,568 B2 | 3/2006 | Qin |
| 7,021,761 B2 | 4/2006 | Künzler et al. |
| 7,025,457 B2 | 4/2006 | Trinh et al. |
| 7,025,458 B2 | 4/2006 | Vu |
| 7,036,932 B2 | 5/2006 | Boulineau et al. |
| 7,048,997 B2 | 5/2006 | Bhalakia et al. |
| 7,077,985 B2 | 7/2006 | Maki et al. |
| 7,104,648 B2 | 9/2006 | Dahi et al. |

| | | | |
|---|---|---|---|
| 7,258,437 | B2 | 8/2007 | King et al. |
| 7,335,702 | B2 | 2/2008 | La Dous |
| 7,350,917 | B2 | 4/2008 | Kawai et al. |
| 7,465,414 | B2 | 12/2008 | Knox et al. |
| 7,500,749 | B2 | 3/2009 | Vu |
| 8,002,935 | B2 | 8/2011 | Sugimura |
| 8,029,705 | B2 | 10/2011 | Bhalakia et al. |
| 8,128,224 | B2 | 3/2012 | Maki et al. |
| 2001/0035935 | A1 | 11/2001 | Bhalakia et al. |
| 2002/0197484 | A1 | 12/2002 | Nishizawa et al. |
| 2003/0184863 | A1* | 10/2003 | Nakagoshi ................... 359/491 |
| 2004/0125335 | A1 | 7/2004 | Vu |
| 2004/0125337 | A1 | 7/2004 | Boulineau et al. |
| 2004/0207809 | A1 | 10/2004 | Blackburn et al. |
| 2005/0009964 | A1 | 1/2005 | Sugimura et al. |
| 2005/0168689 | A1 | 8/2005 | Knox |
| 2005/0168690 | A1 | 8/2005 | Kawai et al. |
| 2005/0233153 | A1 | 10/2005 | Qin et al. |
| 2006/0065989 | A1 | 3/2006 | Druffel et al. |
| 2006/0146278 | A1 | 7/2006 | Vu |
| 2006/0187411 | A1 | 8/2006 | Boulineau et al. |
| 2006/0192306 | A1 | 8/2006 | Giller et al. |
| 2006/0244909 | A1 | 11/2006 | Maki et al. |
| 2006/0264563 | A1 | 11/2006 | Hanrahan et al. |
| 2007/0001327 | A1 | 1/2007 | Chiu |
| 2007/0122626 | A1 | 5/2007 | Qin et al. |
| 2007/0177100 | A1 | 8/2007 | Knox |
| 2007/0291345 | A1 | 12/2007 | Kumar et al. |

FOREIGN PATENT DOCUMENTS

| | | |
|---|---|---|
| EP | 0 050 594 A2 | 4/1982 |
| EP | 0 134 633 A2 | 3/1985 |
| EP | 0 299 509 A2 | 1/1989 |
| EP | 0 415 716 A1 | 6/1991 |
| EP | 0 552 498 A1 | 7/1993 |
| EP | 0 814 956 B2 | 1/1998 |
| EP | 1 162 482 A2 | 12/2001 |
| EP | 1 273 935 A1 | 1/2003 |
| EP | 1 941 319 A | 7/2008 |
| GB | 2 174 711 A | 11/1986 |
| JP | 56013139 | 2/1981 |
| JP | 58173181 A | 10/1983 |
| JP | 60-195515 A | 10/1985 |
| JP | 61-005910 | 1/1986 |
| JP | 61-032004 | 2/1986 |
| JP | 61-236521 A | 10/1986 |
| JP | 61-276882 | 12/1986 |
| JP | 63-061203 | 3/1988 |
| JP | 63-178193 | 7/1988 |
| JP | 64-22538 | 1/1989 |
| JP | 03-132701 | 6/1991 |
| JP | 03 282445 | 12/1991 |
| JP | 32-69507 | 12/1991 |
| JP | 4-358145 | 12/1992 |
| JP | 05 032965 | 2/1993 |
| JP | 62-38689 | 8/1994 |
| JP | 07 048363 | 2/1995 |
| JP | 90-01716 A | 1/1997 |
| JP | 2002196103 A | 7/2002 |
| JP | 2004 034609 | 2/2004 |
| WO | WO 81/00769 A1 | 3/1981 |
| WO | WO 95/15845 A1 | 6/1995 |
| WO | WO 96/34735 A1 | 11/1996 |
| WO | WO 98/37115 A1 | 8/1998 |
| WO | WO 01/49478 A2 | 7/2001 |
| WO | WO 02/093235 A1 | 11/2002 |
| WO | WO 03/078148 A1 | 9/2003 |
| WO | WO 2004/011235 A1 | 2/2004 |
| WO | WO 2004/068217 A2 | 8/2004 |
| WO | WO 2005/023529 A2 | 3/2005 |
| WO | WO 2006/094313 A2 | 9/2006 |
| WO | WO 2007/041347 A2 | 4/2007 |

OTHER PUBLICATIONS

United States Patent and Trademark Office, Office Action mailed Jul. 1, 2011 in U.S. Appl. No. 11/458,255, 22 pages.
United States Patent and Trademark Office, Notice of Allowance mailed Jun. 8, 2011 in U.S. Appl. No. 11/398,819, 6 pages.
United States Patent and Trademark Office, Notice of Allowance mailed Apr. 1, 2011 in U.S. Appl. No. 11/368,929, 27 pages.
United States Patent and Trademark Office, Office Action mailed Mar. 24, 2011 in U.S. Appl. No. 10/938,275, 14 pages.
United States Patent and Trademark Office, Notice of Allowance mailed Mar. 10, 2011 in U.S. Appl. No. 11/458,255, 7 pages.
United States Patent and Trademark Office, Office Action mailed Jan. 6, 2011 in U.S. Appl. No. 12/401,277, 13 pages.
IP Australia, Notice of Acceptance mailed Nov. 17, 2010 in Australian Patent Application No. 2004270746, 3 pages.
United States Patent and Trademark Office, Office Action mailed Oct. 6, 2010 in U.S. Appl. No. 11/368,929, 12 pages.
United States Patent and Trademark Office, Office Action mailed Sep. 17, 2010 in U.S. Appl. No. 11/458,255, 9 pages.
United States Patent and Trademark Office, Office Action mailed Sep. 7, 2010 in U.S. Appl. No. 12/401,277, 12 pages.
United States Patent and Trademark Office, Notice of Allowance mailed Aug. 31, 2010 in U.S. Appl. No. 11/537,571, 4 pages.
United States Patent and Trademark Office, Office Action mailed May 28, 2010 in U.S. Appl. No. 11/537,571, 6 pages.
United States Patent and Trademark Office, Office Action mailed May 26, 2010 in U.S. Appl. No. 11/398,819, 6 pages.
European Patent Office, Examination Report mailed Apr. 26, 2010 in European Patent Application No. 03 744 674.7-2307, 5 pages.
United States Patent and Trademark Office, Office Action mailed Mar. 29, 2010 in U.S. Appl. No. 12/401,277, 12 pages.
United States Patent and Trademark Office, Final Office Action mailed Mar. 8, 2010 in U.S. Appl. No. 11/458,255, 7 pages.
United States Patent and Trademark Office, Final Office Action mailed Feb. 23, 2010 in U.S. Appl. No. 10/938,275, 11 pages.
European Patent Office, Examination Report dated Jan. 29, 2010 in European Patent Application No. 04009085.4-2217, 3 pages.
IP Australia, Examiner's Report mailed Oct. 29, 2009 in Australian Patent Application No. 2004270746, 3 pages.
United States Patent and Trademark Office, Final Office Action mailed Oct. 29, 2009 in U.S. Appl. No. 11/368,929, 9 pages.
United States Patent and Trademark Office, Office Action mailed Aug. 24, 2009 in U.S. Appl. No. 11/537,571, 12 pages.
United States Patent and Trademark Office, Office Action mailed Aug. 6, 2009 in U.S. Appl. No. 11/398,819, 5 pages.
United States Patent and Trademark Office, Office Action mailed Jul. 16, 2009 in U.S. Appl. No. 10/938,275, 10 pages.
United States Patent and Trademark Office, Office Action mailed Jun. 22, 2009 in U.S. Appl. No. 11/458,255, 5 pages.
United States Patent and Trademark Office, Office Action mailed Mar. 9, 2009 in U.S. Appl. No. 11/368,929, 16 pages.
European Patent Office, Examination Report mailed Mar. 3, 2009 in European Patent Application No. 03744674.7-2307, 3 pages.
United States Patent and Trademark Office, Final Office Action mailed Jan. 23, 2009 in U.S. Appl. No. 11/458,255, 5 pages.
European Patent Office, Examination Report dated Jan. 22, 2009 in European Patent Application No. 03 772 064.6-1211, 4 pages.
United States Patent and Trademark Office, Final Office Action mailed Dec. 5, 2008 in U.S. Appl. No. 10/938,275, 10 pages.
United States Patent and Trademark Office, Final Office Action mailed Dec. 1, 2008 in U.S. Appl. No. 11/398,819, 6 pages.
United States Patent and Trademark Office, Notice of Allowance mailed Oct. 28, 2008 in U.S. Appl. No. 11/370,731, 7 pages.
United States Patent and Trademark Office, Office Action mailed Jun. 24, 2008 in U.S. Appl. No. 11/458,255, 8 pages.
United States Patent and Trademark Office, Office Action mailed Jun. 20, 2008 in U.S. Appl. No. 10/938,275, 10 pages.
European Patent Office, Examination Report mailed May 14, 2008 in European Patent Application No. 06816842.7-1234, 2 pages.
United States Patent and Trademark Office, Office Action mailed May 1, 2008 in U.S. Appl. No. 11/370,731, 11 pages.
United States Patent and Trademark Office, Office Action mailed Apr. 8, 2008 in U.S. Appl. No. 11/398,819, 6 pages.
United States Patent and Trademark Office, Final Office Action mailed Feb. 8, 2008 in U.S. Appl. No. 10/764,762, 10 pages.
United States Patent and Trademark Office, Notice of Allowance mailed Jan. 25, 2008 in U.S. Appl. No. 11/398,814, 7 pages.

United States Patent and Trademark Office, Office Action mailed Oct. 18, 2007 in U.S. Appl. No. 11/370,731, 11 pages.
United States Patent and Trademark Office, Final Office Action mailed Oct. 9, 2007 in U.S. Appl. No. 10/938,275, 9 pages.
IP Australia, Examiner's Report mailed Sep. 12, 2007 in Australian Patent Application No. 2003225785, 2 pages.
WIPO, U.S. International Searching Authority, International Search Report and Written Opinion mailed Aug. 27, 2007 in International Patent Application No. PCT/US06/08444, 7 pages.
United States Patent and Trademark Office, Office Action mailed Jul. 10, 2007 in U.S. Appl. No. 11/398,814, 10 pages.
United States Patent and Trademark Office, Office Action mailed Jul. 3, 2007 in U.S. Appl. No. 10/630,277, 6 pages.
United States Patent and Trademark Office, Office Action mailed May 17, 2007 in U.S. Appl. No. 10/764,762, 13 pages.
Folatjar, D.A. and Horn, K., "Polycarbonates," in *Techniques de l'Ingénieur, traité Plastiques et Composites* vol. AM3 (Trmenstrial), Blanc, André, ed., Apr. 14, 2007, 15 pp.
WIPO, U.S. International Searching Authority, International Search Report and Written Opinion mailed Mar. 6, 2007 in International Patent Application No. PCT/US06/38142, 4 pages.
United States Patent and Trademark Office, Office Action mailed Jan. 8, 2007 in U.S. Appl. No. 10/938,275, 10 pages.
United States Patent and Trademark Office, Notice of Intent to Issue Ex Parte Reexamination Certificate mailed Dec. 28, 2006 in U.S. Appl. No. 90/007,325, 12 pages.
United States Patent and Trademark Office, Final Office Action mailed Dec. 19, 2006 in U.S. Appl. No. 11/398,814, 9 pages.
European Patent Office, Examination Report dated Nov. 13, 2006 in European Patent Application No. 04 009 085.4-2217, 2 pages.
United States Patent and Trademark Office, Final Office Action mailed Nov. 8, 2006 in U.S. Appl. No. 10/630,277, 5 pages.
United States Patent and Trademark Office, Final Office Action mailed Nov. 2, 2006 in U.S. Appl. No. 10/764,762, 9 pages.
United States Patent and Trademark Office, Office Action mailed Aug. 25, 2006 in U.S. Appl. No. 90/007,325, 19 pages.
United States Patent and Trademark Office, Office Action mailed Jul. 5, 2006 in U.S. Appl. No. 11/398,814, 8 pages.
United States Patent and Trademark Office, Office Action mailed Mar. 21, 2006 in U.S. Appl. No. 10/764,762, 11 pages.
United States Patent and Trademark Office, Notice of Allowance mailed Mar. 15, 2006 in U.S. Appl. No. 10/389,353, 8 pages.
United States Patent and Trademark Office, Office Action mailed Feb. 24, 2006 in U.S. Appl. No. 10/630,277, 8 pages.
European Patent Office, Examination Report dated Feb. 15, 2006 in European Patent Application No. 04 009 085.4-17, 3 pages.
United States Patent and Trademark Office, Notice of Allowance mailed Nov. 16, 2005 in U.S. Appl. No. 09/848,594, 6 pages.
United States Patent and Trademark Office, Notice of Allowance mailed Nov. 10, 2005 in U.S. Appl. No. 10/636,383, 7 pages.
WIPO, U.S. International Preliminary Examining Authority, International Preliminary Report on Patentability mailed Sep. 20, 2005 in International Patent Application No. PCT/US04/30023, 4 pages.
European Patent Office, Examination Report dated Sep. 2, 2005 in European Patent Application No. 03 772 064.6-1253, 5 pages.
United States Patent and Trademark Office, Office Action mailed Jul. 27, 2005 in U.S. Appl. No. 10/389,353, 8 pages.
United States Patent and Trademark Office, Final Office Action mailed Jun. 21, 2005 in U.S. Appl. No. 09/848,594, 7 pages.
WIPO, U.S. International Preliminary Examining Authority, International Preliminary Report on Patentability mailed May 20, 2005 in International Patent Application No. PCT/US2004/001939, 4 pages.
United States Patent and Trademark Office, Final Office Action mailed May 11, 2005 in U.S. Appl. No. 10/636,383, 10 pages.
WIPO, U.S. International Searching Authority, International Search Report and Written Opinion mailed Apr. 4, 2005 in International Patent Application No. PCT/US04/30023, 8 pages.
WIPO, U.S. International Preliminary Examining Authority, International Preliminary Report on Patentability mailed Mar. 18, 2005 in International Patent Application No. PCT/US2003/023744, 4 pages.
United States Patent and Trademark Office, Office Action mailed Jan. 25, 2005 in U.S. Appl. No. 10/389,353, 10 pages.

WIPO, U.S. International Search Authority, International Search Report and Written Opinion mailed Dec. 16, 2004 in International Patent Application No. PCT/US2004/001939, 9 pages.
United States Patent and Trademark Office, Office Action mailed Dec. 8, 2004 in U.S. Appl. No. 09/848,594, 8 pages.
European Patent Office, Supplementary European Search Report dated Nov. 11, 2004 in European Patent Application No. EP 04 00 9085, 2 pages.
United States Patent and Trademark Office, Office Action mailed Sep. 21, 2004 in U.S. Appl. No. 10/636,383, 9 pages.
United States Patent and Trademark Office, Office Action mailed Jul. 27, 2004 in U.S. Appl. No. 10/183,088, 3 pages.
WIPO, U.S. International Preliminary Examining Authority, Written Opinion mailed Jun. 9, 2004 in International Patent Application No. PCT/US2003/023744, 4 pages.
European Patent Office, Decision to Grant dated Mar. 11, 2004 in European Patent Application No. 96908587.7-2217 0814956, 1 pages.
United States Patent and Trademark Office, Office Action mailed Feb. 20, 2004 in U.S. Appl. No. 09/848,594, 9 pages.
United States Patent and Trademark Office, Notice of Allowance mailed Dec. 17, 2003 in U.S. Appl. No. 10/183,088, 5 pages.
WIPO, U.S. International Search Authority, International Search Report mailed Dec. 15, 2003 in International Patent Application No. PCT/US2003/023744, 6 pages.
United States Patent and Trademark Office, Office Action mailed Jun. 2, 2003 in U.S. Appl. No. 09/848,594, 12 pages.
United States Patent and Trademark Office, Office Action mailed Apr. 9, 2003 in U.S. Appl. No. 10/183,088, 8 pages.
United States Patent and Trademark Office, Final Office Action mailed Mar. 5, 2003 in U.S. Appl. No. 09/854,419, 11 pages.
European Patent Office, Examination Report dated Jan. 9, 2003 in European Patent Application No. 96 908 587.7-2217, 3 pages.
United States Patent and Trademark Office, Office Action mailed Sep. 4, 2002 in U.S. Appl. No. 09/854,419, 12 pages.
European Patent Office, Examination Report dated May 7, 2002 in European Patent Application No. 96 908 587.7-2217, 3 pages.
European Patent Office, Examination Report dated Jun. 29, 2001 in European Patent Application No. 96 908 587.7-2217, 4 pages.
United States Patent and Trademark Office, Notice of Allowance mailed Jan. 8, 2001 in U.S. Appl. No. 09/425,517, 7 pages.
European Patent Office, Examination Report dated Dec. 27, 2000 in European Patent Application No. 96 908 587.7-2217, 7 pages.
United States Patent and Trademark Office, Office Action mailed Sep. 22, 2000 in U.S. Appl. No. 09/425,517, 11 pages.
European Patent Office, Supplementary European Search Report dated Nov. 11, 1998 in European Patent Application No. EP 96 90 8587, 3 pages.
WIPO, U.S. International Search Authority, International Search Report mailed Aug. 14, 1996 in International Patent Application No. PCT/US96/02777, 1 pages.
ORCOLITE, Press release: "ORCOLITE® Releases the Industry's first Prescription Polarized Polycarbonate lens—PolarPoly™," Oct. 2, 1995, Azusa, California, 2 pages.
Mitsubishi Engineering Plastics Corp., Material Safety Data sheet, Jun. 1, 1995, 4 pages.
Narisawa, H. et al., "Photocontrol of orientation of photochromic dichroic dyes in cholesteric polymer films," *Macromol. Chem.. Phys.* 196, May 1995, pp. 1419-1430.
Sisido, M. et al., "Induced Circular Dichroism from Cholesteric Polypeptide Films Doped with an Azobenzene Derivative," *Macromolecules*, 1993, 26 pp. 1424-2428.
Frames Product Guide, "Lenses," Jan. 1993, 2 pages.
Krongauz, V.A. "Chapter 21: Environmental Effects on Organic Photochromic Systems," in *Studies in Organic Chemistry* 40, Dürr, H., Bouas-Laurent, H., Eds.; Elsevier: Amsterdam, 1990, pp. 793-821.
MGC, "Coated Film Insert Injection Process," Oct. 1988, pp. 122-128, Rev. 1993.8, Lot No. 93 08 2000 DPR.
Asakura Shoten Co., Ltd, publisher, "10.5.3 Types of eyeglass lenses," Extract from "Kougaku Gijutsu Handbook", supplementary edition. Fifth Edition published Aug. 10, 1980, 4 pages.

McGraw-Hill Book Company, "Eye glasses," in *McGraw-Hill Encyclopedia of Science and Technology*, 1960, pp. 172-173.
Japanese Publication, undated.
KB Co. Publication, undated.
United States Patent and Trademark Office, Notice of Allowance mailed Oct. 2, 2012 in U.S. Appl. No. 12/959,201, 10 pages.
United States Patent and Trademark Office, Notice of Allowance mailed Aug. 30, 2012 in U.S. Appl. No. 12/401,277, 9 pages.
European Patent Office, Decision to Grant dated Aug. 13, 2012 in European Patent Application No. 03 744 674.7, 34 pages.
United States Patent and Trademark Office, Notice of Allowance mailed Jun. 27, 2012 in U.S. Appl. No. 10/938,275, 5 pages.
European Patent Office, Supplementary European Search Report dated Jan. 20, 2012 in European Patent Application No. 06815842.7, 7 pages.
United States Patent and Trademark Office, Final Office Action mailed Jan. 5, 2012 in U.S. Appl. No. 10/938,275, 30 pages.
European Patent Office, Examination Report dated Nov. 2, 2011 in European Patent Application No. 03 744 674.7, 5 pages.
European Patent Office, Supplementary European Search Report dated Oct. 14, 2010 in European Patent Application No. 04784021.0, 3 pages.

* cited by examiner

FORMING METHOD FOR POLYMERIC LAMINATED WAFERS COMPRISING DIFFERENT FILM MATERIALS

CROSS-REFERENCE TO RELATED APPLICATIONS

The present application is a continuation of U.S. patent application Ser. No. 11/368,929 filed Mar. 6, 2006 now U.S. Pat. No. 8,002,935 entitled Forming Method For Polymeric Laminated Wafers Comprising Different Film Materials, which is related to and claims priority from U.S. provisional application Ser. No. 60/658,800 filed on Mar. 4, 2005 entitled Forming Method For Polymeric Laminated Wafers Comprising Different Film Materials, both of which are incorporated herein by reference in their entireties.

FIELD OF THE INVENTION

The present invention relates to a method for forming polymeric laminates.

BACKGROUND OF THE INVENTION

Formed wafers are curved laminates often produced as an intermediate step to a completed lens. For example, a wafer may be produced having a delicate functional layer, such as a polarizing or photochromic layer, sandwiched by a first, protective layer and a second, base layer. The wafer is then formed to have a base curve. The formed wafer is then placed in an injection mold chamber where a molten lens material is injected behind the wafer to form a lens against the base layer of the wafer. In the alternative, the formed wafer can be used simply as a piano lens by itself, e.g., as a plano polarized or photochromic sunglass lens or sungoggle, i.e., without injecting a molten lens material behind the wafer. An example of such a wafer is disclosed in publication EP 0 299 509 A2 by Kawaki et al., incorporated by reference herein in its entirety.

The wafers are typically formed via a process that includes first heating the polymeric wafer to a softening temperature. This heating step may be accomplished in a variety of ways such as with hot air or heated forming molds. Next the softened wafer is placed in a forming cup and either pressed or sucked into the forming cup. The wafer is held in the cup until it sets, thus assuming the shape of the forming cup. The wafer is then removed and cooled to ambient temperature.

Typical heating or softening temperatures for use in forming the laminated wafer are determined by the thermal properties of the materials chosen for producing the laminated wafer. One example of materials that have been previously used in making laminated wafers is polycarbonate resin films or sheets. Polycarbonate films or sheets include general aromatic polycarbonate resin sheets prepared from bisphenols (e.g., bisphenol A) and phosgene or carbonic esters and sheets prepared from transparent copolycarbonate resins or transparent resin compositions containing other resins. If desired, these polycarbonate sheets may thereafter be coated or otherwise treated with a functional coating, such as heat-formable hard coat, an anti-fogging coat, an infrared-reflective or infrared-absorbable coat, an ultra-violet reflective or ultra-violet absorbable coat or other similar functional coatings that are known in the art.

Other materials contemplated for use in making laminated wafers may include adhesives or functional materials such as polarizing films or photochromic films. Examples of adhesives that are contemplated for use in laminated wafers may include PVA adhesives or urethane adhesives that are commonly known in the polycarbonate lens industry. Examples of a polarizing film suitable for use in laminated wafers include a polarizing film containing components such as polyvinyl alcohol polymer (PVA) film, which is monoaxially stretched before dyeing, or dyed before monoaxial stretching, and subjected to fixing treatment with a boron compound (in some cases, the dyeing and fixing treatment are conducted simultaneously). Other examples of functional materials may include polyester polarizers or photochromic polarizing films.

Once the functional layer, such as a polarizing PVA film, has been incorporated, then a protective film having optical transparency and mechanical strength is normally laminated on each surface or one surface thereof. Examples of protective layer materials would typically include materials such as cellulose tri-acetate (CTA) film, cellulose acetate butyrate (CAB) and other cellulose resins, cyclic olefin, polyesters, such as polyethylenetelephthalate (PET) and its alloy or modified resin, polycarbonate alloy and copolymer with other polymer(s), polyethylenenaphthalate (PEN), and acrylic resins, such as polymethyl methacrylate (PMMA).

Laminated wafers having the above-described materials are thereafter formed into curved laminates. This process is commonly accomplished using a machine, such as those made by Lema of Italy. The Lema machines have a thermostatically-controlled electric heating chamber with an air blower, and forming cups mounted on a rotating turret. A vacuum hole at the bottom of each forming cup allows the wafers to be sucked into the cups and held in place with a vacuum. Vacuum control valves hold the wafers until they reach a designated position on the rotating turret at which time they are released.

Other machines that are suitable for use in making laminated wafers are produced by Japanese companies such as Wintec and Fuji Kasei. These are similar to the Lema machine but also include wafer pre-heating units, pick and place mechanisms, and plungers to mechanically press the wafers into the vacuum cups. Some machines also have a cooling conveyor or other apparatus used to achieve desired formation(s) of selected wafer components.

These machines perform adequately when forming a wafer that has a protective layer and a base layer having similar properties and/or materials. However, they are found to be deficient to form wafers where the protective layer is different than its base layer. Materials having similar properties, such as softening properties, can be heated and formed uniformly at a uniform temperature. For example, the softening temperature of a laminated wafer having a protective layer and a base layer comprised entirely of polycarbonate materials, or similar-propertied materials, is at or near approximately 285° F. Therefore, placing the laminated wafer in a heated environment possessing a uniform temperature of approximately 285° F. over a prescribed amount of time will result in a softening and formation of a uniformly curved laminated wafer, appropriate for use thereafter in a manufacturing process, such as injection molding. However, preparing a laminated wafer where one or more layers have properties and/or materials that are different from other layers, and exposing such a wafer to a uniform heat that is outside a prescribed or required softening temperature for one of the materials will result either in inadequate softening and forming (e.g. when the temperature is too low) or, alternatively, a softening of the material to a point of damaging the material (e.g. when the temperature is too high).

One example of a laminated wafer having different layer materials is a wafer having a CAB film as a protective layer, a PVA film as a polarizer functional layer, and a polycarbonate film as a base layer. The optimum softening and forming temperature for the polycarbonate film base layer occurs at or near 285° F. At temperatures substantially below this temperature (e.g. t 270° F. or below), polycarbonate does not undergo adequate softening due to its chemical and structural properties, namely its thermal properties. Alternatively, at temperatures above 260° F., CAB becomes too soft because the temperature is too high to maintain the chemical and structural integrity of the material due to its underlying thermal properties. Thus, the aforementioned machines are unable to form a wafer including, for example, a CAB film protective layer and a polycarbonate film base layer because there is no operational temperature window that satisfies both layers.

There is thus a need for a machine that is able to soften and form laminated wafers having different layers of materials with diverse thermal properties.

OBJECTS AND SUMMARY OF THE INVENTION

In view of the foregoing, it is an object of the present invention to provide a process of making a laminated wafer that overcomes the limitations of the prior art.

It is another object to provide a process wherein the method of making the present invention is efficient and economical.

These and other objects not specifically enumerated here are addressed by the present invention wherein one object of the present invention provides a method for forming a laminated wafer having at least a first layer and a second layer comprising placing the wafer in a heated environment having a first temperature capable of softening the first layer, exposing the second layer, and not the first layer, to a second temperature higher than the first temperature, the second temperature capable of softening the second layer, and forming the laminated wafer into a desired shape.

Another object of the present invention relates to a laminated wafer comprising different materials that are formed at different softening temperatures.

DESCRIPTION OF THE INVENTION

Figure 1:
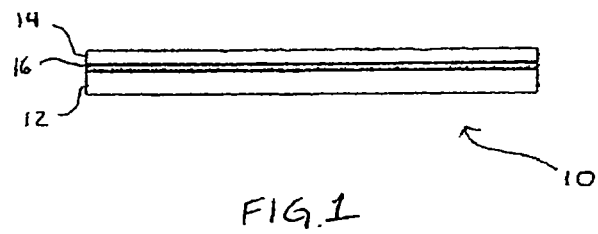
FIG. 1 is a cross-sectional view of a typical laminated wafer to which the present invention is directed.

The present invention provides a method for forming wafers whereby different temperatures are applied to either side of the wafer, in which each side has different materials and/or thermal properties. An example of such a wafer is shown in FIG. 1. The wafer 10 is laminated and includes a first layer 12 and a second layer 14. Sandwiched between the first layer 12 and the second layer 14 is a functional layer 16.

One embodiment of the wafer having a first layer 12 and a second layer 14, includes a first layer comprising CAB film and a second layer 14 comprising a polycarbonate film. CAB film is commercially available by companies such as Kodak (sold under the name KODACEL®) and comes in various grades. In another embodiment, any material possessing low to no birefringence at Tg between 100° C. and 150° C., such as CAB film, is a good candidate for a first layer 12 (also referred to as a protective layer) of the wafer 10. As for the polycarbonate second layer 12, commercial sources of polycarbonate film include GE (LEXAN® T2FOQ), Teijin (PANLITE® 1151, 2151), and Bayer (Makrofoil DE). Modified polycarbonates and polycarbonate alloy film would also be well-suited for use as layers in the present invention.

The functional layer 16 typically gives the lens to which the wafer 10 will be applied a desired property. For example, the functional layer 16 may include a photochromic or polarizing layer, such as a polyester polarizer, a multi-layer film for reflecting and transmitting a specific wave length, or a combination of these properties, as found in a photochromic polarizing layer. The first layer 12 is often a protective layer that protects the functional layer 16 from the elements. The second layer 14 is often referred to as a base layer and, in one embodiment, is eventually fused to a lens. However, the present invention contemplates interchangeable use of materials for a first layer and a second layer of a laminated wafer, as herein described.

Figure 2:
FIG. 2 is a cross-sectional view of the wafer of FIG. 1 having been formed in accordance with the methods of the present invention.

FIG. 2 shows the wafer 10 after it has been formed. The wafer 10 has been curved to match the curve either of a piano lens or a curve of a lens blank to which the wafer may be adhered. Formed wafers 10 are often used in manufacturing processes such as injection molding operations, such as those employed in production of ophthalmic lenses. The curve of the wafer 10 thus substantially matches the curve of the inside mold cavity wall. In this case, the first layer 12 would be placed against the anterior wall of the mold and the lens material is injected into the posterior side of the mold against the second layer 14.

Figure 3:
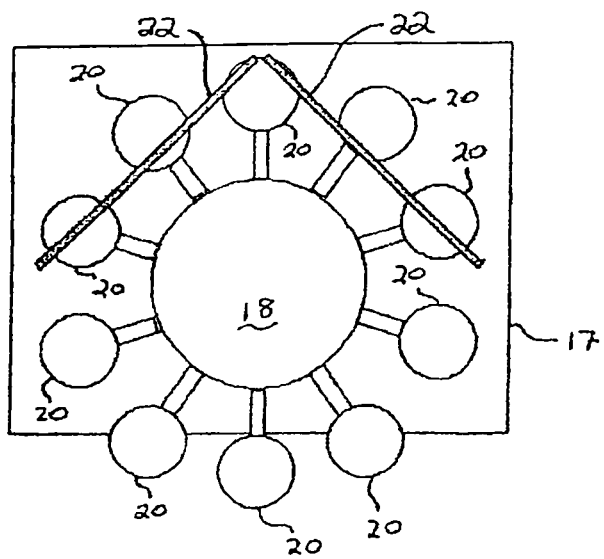
FIG. 3 is a plan view of an embodiment of a device useable in practicing the method of the present invention.

Referring now to FIG. 3, the machine of the present invention includes a heating chamber 17 containing a turret unit 18 having a plurality of vacuum suction forming cups or molds 20 for receiving the wafers 10. The wafer 10 is placed in a forming cup 20 and the vacuum level is set in the heating chamber 17 at 10-760 mmHg, and most preferably, 100-650 mmHg.

The heating chamber 17 also contains electric heaters and a convection blower (not shown). This heating chamber 17 provides a first heating temperature that is distributed uniformly throughout the heating environment. Most preferably, the first heating temperature will be set to a temperature sufficient to soften a first layer of wafer material, based on its thermal properties (typically, a lower temperature than a second temperature that is required to soften a second layer of wafer material). The heating chamber 17 may further provide one temperature controller that maintains the air temperature throughout the heating chamber at a desired setting (e.g., a first temperature) as well as the temperature of the forming cups 20. In a preferred embodiment, the heating chamber 17 will provide an air temperature that is set near the first layer material's glass transition temperature (Tg) or slightly lower (5-15° C.) than Tg.

The heating chamber 17 further contains a second source for introducing heat into the chamber 17. This second heat source enables the chamber 17 to direct heat specifically to one layer of each wafer and thereby heat that layer with heat at a temperature different from the air temperature otherwise being generated by the chamber 17. This second heat source therefore allows two different temperatures to be imparted onto the wafers. In one embodiment, the chamber 17 heats (through its first heat source (e.g. electrical heater and convection blower) the protective and functional layers 12, 16 to a first air temperature in the chamber 17 while the base layer 14 is heated to a higher temperature from the second heat source.

The second heating source may be provided by heating devices such as infrared heaters, directed hot air jet(s), or hot metal plunger(s) that are placed in contact with a second (or, higher softening temperature) material, holding a wafer between the lower temperature moving, forming cups 20 and hot metal plungers (not shown).

In a preferred embodiment of the present invention, the second source of heat is provided by infrared heaters 22 as shown in FIG. 3. The infrared heaters 22 are positioned inside the heating chamber 17 above the moving, forming cups 20. Infrared heaters 22 are selected such that they will emit infrared rays having a wavelength that is efficiently absorbed by the base layer 14 material and not passed through to the functional layers 16 and/or the protective layer 12 of each wafer. For example, a polycarbonate film has been shown to pass infrared rays that are between 800 to 2300 nm (near infrared) but absorb infrared having a wavelength longer than 2300 nm (far infrared). Thus, the infrared heaters 22 are selected to emit infrared rays in the far infrared range rather than in the near infrared range, as corresponding with the thermal properties of the selected wafer materials. One example of an infrared heater 22 contemplated for use in the present invention is a Watlow Quartz Heater, having a ⅜" diameter×19 inches long and further having a 204 volt×15 amp maximum power capacity. A quartz infrared heater 22 of these specifications emits a peak wavelength of 2500 nm, which can be adjusted to a desired percent output based on the selected wafer material for heating. For example, a quartz infrared heater set to 90% output would emit a peak wavelength of about 2300 nm.

Further, if necessary, filters may be used between the infrared heaters and the wafers to ensure the functional and protective layers 16, 12 do not encounter the infrared rays. Infrared rays will be absorbed or passed at different wavelengths, based on the properties of the selected wafer materials. Any directed energy sources, as described herein, that produce the same practical effect of softening and/or forming a wafer with different materials, are therefore contemplated for use in the present invention.

In a preferred embodiment as shown in FIG. 3, the heating chamber 17 has a rotating turret 18 which further includes support arms extending to the forming, molding cups 20 that support each wafer 10. The vacuum suction of the forming cup 20 holds the wafer 10 to the forming cup 20 while the turret 18 rotates the wafers through the heating chamber in a predetermined heating cycle. In this embodiment, wafers 10 are rotated through the heating chamber 17 at a cycle rate correlating to the number of wafers 10 to be heated. For example, when one wafer 10 is placed into the heating chamber 17 and run through a cycle, the cycle duration is 25 seconds times 1 wafer 10, resulting in a 25-second cycle. However, when ten wafers 10 are placed in 10 forming cups 20 (as shown in FIG. 10) in the heating chamber 17 and run through a cycle, the total cycle time or cycle duration is 25 seconds times 10 wafers, resulting in a 250-second cycle time.

This process may further be accomplished by manual or other automated mechanisms that promote forming or curving of wafers in any environment that permits different softening conditions or temperatures for different material properties of the layers, and are thus not limited to the illustrative examples of heating chambers as described and disclosed herein.

EXAMPLES

The device and method of forming polymeric laminated wafers comprising different film materials of the present invention will now be described in more detail in reference to examples, which are for illustrative purposes only and should not in any way be construed as a limitation upon the scope of the invention. The following are examples of wafers made using the present invention and comparative examples using various prior art methods. The first two comparative examples use a wafer having base layers and protective layers that are comprised of the same material in order to demonstrate the required settings to achieve the desired base form. The second two comparative examples attempt to form a wafer using the materials used in the Example.

Example 1

A wafer produced by Polaroid Corporation having a polarizer laminate comprising 1.35 mil CAB protective layer (KODACEL® brand CAB film, product code K7755), 1.2 mil PVA polarizer layer (custom formulated from raw material PVA: Vinylon made by Kuraray of Japan) and 10 mil polycarbonate base layer was punched into an 80 mm diameter disc and placed in a Lema P-10 forming machine with a quartz infrared heater 3 inches above the forming cups with a power controller. Air temperature was set to 225° F., bringing the cup temperature to approximately 220° F. The infrared heater power, having a power capacity of 204 volt×15 amp maximum (thereby a 2500 nm maximum wavelength output), was set to 90%. Cycle time for one wafer was set at 25 seconds and the forming cup was a 6 base.

Result: The wafer was formed to 6 base without any damage to the CAB protective layer of the wafer or to the adhesive that joins the layers of the wafer together.

Comparative Example 1A

A wafer made by Fuji Kasei of Japan having polycarbonate as a base layer, a PVA polarizing element as a functional layer, and polycarbonate as a protective layer was formed using a Lema P-10 forming machine without using infrared heating. The temperature was set to 235° F. Cycle time for one wafer was set at 25 seconds.

Result: The wafer stayed almost flat and was not formed to a 6 base due to insufficient heat for forming the polycarbonate.

Comparative Example 1B

A wafer made by Fuji Kasei of Japan having polycarbonate as a base layer, a PVA polarizing element as a functional layer, and polycarbonate as a protective layer was formed using a Lema P-10 forming machine without using infrared heating. The temperature was set to 285° F. Cycle time for one wafer was set at 25 seconds.

Result: The wafer was successfully formed to a 6 base.

Comparative Example 1C

A wafer produced by Polaroid Corporation having a polarizer laminate comprising 1.35 mil CAB protective layer, 1.2 mil PVA polarizer layer and 10 mil polycarbonate base layer was punched into an 80 mm diameter disc and placed in a Lema P-10 forming machine without the presence of infrared heaters. Air temperature was set to 235° F. and the cycle time for one wafer was set at 25 seconds and the forming cup was a 6 base.

Result: The wafer stayed almost flat and was not formed to a 6 base due to insufficient heat to the polycarbonate layer.

Comparative Example 1D

A wafer produced by Polaroid Corporation having a polarizer laminate comprising 1.35 mil CAB protective layer, 1.2 mil PVA polarizer layer and 10 mil polycarbonate base layer was punched into an 80 mm diameter disc and placed in a Lema P-10 forming machine without the presence of infrared heaters. Air temperature was set to 285° F. and the cycle time for one wafer was set at 25 seconds and the forming cup was a 6 base.

Result: The wafer was badly curled and delaminated due to excessive heat to the CAB layer.

Example 2

A polarizing wafer produced by Shin-wha comprising a 1.35 mil CAB protective layer, a 1.2 mil PVA polarizer layer, and a 12 mil polycarbonate layer was punched into an 86 mm disc and formed using a Lema P-10 fitted with two quartz infrared heaters 3 inches above the forming cups with independent power controllers. The air temperature was set to 245° F. resulting in an approximate cup temperature of 240° F. The cycle time for one wafer was set to 15 seconds and the infrared heater, having a power capacity of 204 volt×15 amp maximum (thereby a 2500 nm maximum wavelength output) was set to 90% for the first heater and 70% for the second heater. The forming cup had a 4.25 base curve.

Result: The wafer was formed to a 4.25 base curve without any damage to the CAB protective layer or the PVA polarizer adhesive layer.

Example 3

An experiment was conducted to see if a wafer could be re-formed using the present invention. A polarizing wafer produced by Shin-wha comprising a 1.35 mil CAB protective layer, a 1.2 mil PVA polarizer layer, and a 12 mil polycarbonate layer was punched into an 86 mm disc and formed using a Lema P-10 fitted with two quartz infrared heaters 3 inches above the forming cups with independent power controllers. The air temperature was set to 245° F. resulting in an approximate cup temperature of 240° F. The cycle time for one wafer was set to 15 seconds and the infrared heater, having a power capacity of 204 volt×15 amp maximum (thereby a 2500 nm maximum wavelength output), was set to 90% for the first heater and 70% for the second heater. The forming cup had a 4.25 base curve. This wafer that was formed to a 4.25 base curve was placed back into the Lema machine and exposed to another cycle as previously described, with the exception that this time, the formed wafer was placed in a cup having an 8.00 base curve. The temperature settings remained the same with the cycle time adjusted to 13 seconds.

Result: The wafer was re-formed to 8.00 base without any damage to the CAB protective layer or the PVA polarizer layer.

Based on these illustrative examples, one skilled in the art would conclude that this method enables forming of laminates having different materials with varying softening temperatures on either side of the wafer. This invention may be applied for thermal forming of various polymeric film laminates consisting of different films having varying optimum forming temperatures, which would otherwise be very difficult, if not impossible to form using conventional forming methods.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are proffered by way of example to facilitate comprehension of the invention and should not be construed to limit the scope thereof.

What is claimed is:

1. A method for forming an optically functional laminated wafer comprising:
   (a) exposing an optically functional laminated wafer to a first temperature;
   (b) heating one side of the optically functional laminate wafer to a temperature higher than the first temperature; and
   (c) shaping the optically functional laminated wafer to a desired shape;
   wherein steps (a) through (c) are conducted substantially simultaneously of one another.

2. The method of claim 1 wherein the step of exposing an optically functional laminated wafer to a first temperature comprises placing the wafer in a heated chamber of a forming machine.

3. The method of claim 1 wherein the step of exposing an optically functional laminated wafer to a first temperature comprises exposing an optically functional laminated wafer having a polarizing functional layer to a first temperature.

4. The method of claim 1 wherein the step of exposing an optically functional laminated wafer to a first temperature comprises exposing an optically functional laminated wafer having a photochromic functional layer to a first temperature.

5. The method of claim 1 wherein the step of exposing an optically functional laminated wafer to a first temperature comprises exposing an optically functional laminated wafer having a protective layer to a first temperature.

6. The method of claim 1 wherein the step of exposing an optically functional laminated wafer to a first temperature comprises exposing an optically functional laminated wafer having a cellulose acetyl butyrate layer to a first temperature.

7. The method of claim 1 wherein the step of heating one side of the optically functional laminate wafer to a temperature higher than the first temperature comprises directing an energy source only at said one side.

8. The method of claim 1 wherein the step of heating one side of the optically functional laminate wafer to a temperature higher than the first temperature comprises directing an infrared energy source at said one side.

9. The method of claim 1 wherein the step of heating one side of the optically functional laminate wafer to a temperature higher than the first temperature comprises heating a base layer of the optically functional laminate wafer.

10. The method of claim 1 wherein the step of heating one side of the optically functional laminate wafer to a temperature higher than the first temperature comprises heating a polycarbonate base layer of the optically functional laminate wafer.

11. The method of claim 1 wherein the step of shaping the optically functional laminated wafer to a desired shape comprises forming the optically functional laminated wafer to have a base curve.

12. A method for forming an optical laminate wafer comprising:
   (a) heating an optical laminate wafer to a first temperature equal at least to a softening temperature of a first layer of the optical laminate wafer;
   (b) selectively directing an energy source at a second layer of the optical laminate wafer such that the second layer is heated to a temperature greater than the softening temperature of the first layer of the optical laminate; and (c) forming the optical laminate wafer into a desired shape; wherein steps (a) through (c) are conducted substantially coincident of one another.

13. The method of claim 12 wherein the step of heating an optical laminate wafer to a first temperature equal at least to a softening temperature of a first layer of the optical laminate wafer comprises placing the optical laminate wafer in a heated chamber of a forming machine.

14. The method of claim 12 wherein the step of heating an optical laminate wafer to a first temperature equal at least to a softening temperature of a first layer of the optical laminate wafer comprises heating an optical laminate wafer having a functional layer.

15. The method of claim 12 wherein the step of heating an optical laminate wafer to a first temperature equal at least to a softening temperature of a first layer of the optical laminate wafer comprises heating an optical laminate wafer having a protective layer.

16. The method of claim 12 wherein the step of heating an optical laminate wafer to a first temperature equal at least to a softening temperature of a first layer of the optical laminate wafer comprises heating an optical laminate wafer having a cellulose acetyl butyrate layer.

17. The method of claim 12 wherein the step of selectively directing an energy source at a second layer of the optical laminate wafer such that the second layer is heated to a temperature greater that the softening temperature of the first layer of the optical laminate wafer comprises directing an infrared energy source at the second layer.

18. The method of claim 12 wherein the step of selectively directing an energy source at a second layer of the optical laminate wafer such that the second layer is heated to a temperature greater that the softening temperature of the first layer of the optical laminate wafer comprises selectively heating a base layer of the optical laminate wafer.

19. The method of claim 12 wherein the step of selectively directing an energy source at a second layer of the optical laminate wafer such that the second layer is heated to a temperature greater that the softening temperature of the first layer of the optical laminate wafer comprises heating a polycarbonate base layer of the optical laminate wafer.

20. The method of claim 12 wherein the step of forming the optical laminate wafer into a desired shape comprises forming the optically functional laminate wafer to have a base curve.

* * * * *

UNITED STATES PATENT AND TRADEMARK OFFICE
CERTIFICATE OF CORRECTION

PATENT NO. : 8,440,044 B2
APPLICATION NO. : 13/192399
DATED : May 14, 2013
INVENTOR(S) : Hideyo Sugimura It is certified that error appears in the above-identified patent and that said Letters Patent is hereby corrected as shown below:

In the Claims:

Column 8, line 39 (claim 6), "cellulose acetyl butyrate" should read --cellulose acetate butyrate--.

Column 9, line 24 (claim 16), "cellulose acetyl butyrate" should read --cellulose acetate butyrate--.

Signed and Sealed this
Sixth Day of August, 2013

Teresa Stanek Rea
*Acting Director of the United States Patent and Trademark Office*